United States Patent [19]

Wilson

[11] Patent Number: 5,199,049
[45] Date of Patent: Mar. 30, 1993

[54] CIRCUIT AND METHOD OF DIGITAL CARRIER DETECTION FOR BURST MODE COMMUNICATION SYSTEMS

[75] Inventor: William B. Wilson, Shillington, Pa.

[73] Assignee: AT&T Bell Laboratories, Murray Hill, N.J.

[21] Appl. No.: 515,293

[22] Filed: Apr. 27, 1990

[51] Int. Cl.$^5$ .............................................. H04B 1/10
[52] U.S. Cl. ..................... 375/104; 455/223; 328/109
[58] Field of Search ............... 375/104, 102, 94, 5; 455/222, 223, 224, 303, 312, 218; 328/109, 110; 329/318, 341, 349, 313

[56] References Cited

U.S. PATENT DOCUMENTS

| | | | |
|---|---|---|---|
| 3,437,937 | 4/1969 | Warfield | 455/221 |
| 3,633,112 | 1/1972 | Anderson | 455/221 X |
| 3,852,671 | 12/1974 | Risley | 455/222 X |
| 3,873,925 | 3/1975 | Eastmond | 455/221 |
| 3,902,123 | 8/1975 | Oomen | 455/221 |
| 3,939,425 | 2/1976 | Toyoshima | 455/222 |
| 3,939,431 | 2/1976 | Cohlman | 375/5 |
| 4,344,175 | 8/1982 | Leslie | 375/94 |
| 4,445,092 | 4/1984 | Yoshinaka et al. | 455/223 |
| 4,458,204 | 7/1984 | Dellande et al. | 375/104 X |
| 4,630,290 | 12/1986 | Kage | 375/104 |
| 4,815,108 | 3/1989 | Oda | 375/102 |

OTHER PUBLICATIONS

"Draft Supplement to IEEE Std 802.3, CSMA/CD Access Method and Physical Layer Specifications", *IEEE Std. 802.3*, Type 10BASE-T Pat Thaler, Feb. 15, 1990 pp. 1-29.

"DP83922 Twisted Pair Transceiver Interface (TPI)", *National Semiconductor*, Dec. 1989, pp. 1-15.

*Primary Examiner*—Curtis Kuntz
*Assistant Examiner*—Tesfaldet Bocure
*Attorney, Agent, or Firm*—Scott W. McLellan

[57] ABSTRACT

A digital squelch circuit for detecting valid data signals in a burst mode communication system, such as a packet-based local area network. Transitions in the input signal to the squelch circuit start a counter which asserts at least one signal a predetermined time from the transition. The absence or presence of the signal when the next transition in the input signal occurs determines if the frequency of the input signal is less than or greater than a frequency related to the predetermined time interval. When a predetermined number of transitions meeting the desired frequency requirement are received, the input signal is judged valid.

14 Claims, 5 Drawing Sheets

CIRCUIT AND METHOD OF DIGITAL CARRIER DETECTION FOR BURST MODE COMMUNICATION SYSTEMS

BACKGROUND OF THE INVENTION

1. Field of the Invention

This invention relates to digital burst mode communication systems in general and, more particularly, to the apparatus and method of detecting valid data signals in said communication systems.

2. Description of the Prior Art

Burst mode communication systems typically use "packets" of digital data to communicate among the users of the system or network. The "packets" are bursts of data that one user sends to all other users of the system, with each user analyzing the received packet to see if it is addressed to it. Several popular local area networks, or LANs, utilize packets to communicate among the users thereof.

There are two prevalent topologies to a local area network: star or ring, or a combination of the two. Typically in a local area network there are several levels or hierarchies: a high-speed "backbone" and a slower local network coupling to the backbone through "repeaters" or multiplexers. An example of such an arrangement is shown in FIG. 1. Here, part of a ring or star network 1 is shown with the high-speed backbone medium 2 (typically a coaxial cable) and repeaters 3 for communication between the backbone medium 2 and users 4. The repeaters 3 communicate to the users 4 in a star configuration using a "slow" speed medium 5 (typically a twisted wire pair for each direction of communication) and corresponding transmit/receive interface units 6. The users 4, usually a computer or PC, can communicate to other users 4 either through the backbone 2 or within the repeater 3. The example of FIG. 1 is based on a local area network for implementing the Institute of Electronic and Electrical Engineers (IEEE) 802.3 10 Base-5, 2, F, or T specifications or proposed specifications for Carrier Sense-Multiple Access/Collision Detection (CSMA/CD) local area network. The 802.3 standard is what most system designers must conform to for compatibility with other manufacturer's systems in implementing 802.3 networks.

One of the most critical components in the network 1 is the digital data (packet) receiver in the interface units 6 and in the repeaters 3. These receivers are subject to more external noise and cross-talk than receivers on the backbone 2 since the transmission medium 5, here twisted wire pairs, are not self-shielding like coax cable. Regardless of what medium the receiver is coupled to, it should only accept packets that have predetermined characteristics, for example: have a minimum amplitude, have a minimum number of transitions, have frequencies above a minimum and below a maximum frequency, etc. These requirements increase the reliability of the system by rejecting noise and receiving only valid data.

SUMMARY OF THE INVENTION

It is therefore desirable to implement a digital data receiver that reliably accepts digital data that meets certain predetermined criteria. For example, the receiver should accept input signals that are either greater than or less than a predetermined frequency or a combination of predetermined frequencies.

It is also desirable to implement in said digital data receiver the aforementioned IEEE 802.3 10 Base-T CSMA/CD proposed receiver specification, or portions thereof, in an economical and efficient manner. Such implementations should be amenable to integration into a substrate with other circuitry.

These and other aspects of the invention are provided for generally by a digital data receiver characterized by a timing means, for generating a first signal a predetermined time after a first polarity transition in an input signal, and a first comparing means, responsive to the first signal and the input signal, for determining if an opposite polarity transition in the input signal occurs before or after the first signal is asserted. The result of the determination indicates to a output that the frequency of the input signal is greater than or less than a predetermined frequency. The predetermined time is substantially one-half the inverse of the predetermined frequency.

In addition, the above aspects are provided for generally by a method of determining if an input signal to a digital data receiver has a frequency which is greater than or less than a predetermined frequency, characterized by the steps of: asserting a first signal a predetermined time after a first polarity transition in the input signal, the predetermined time being one-half the inverse of the predetermined frequency; and determining if an opposite polarity transition in the input signal occurred before or after the assertion of the first signal. If the opposite polarity transition occurs before the assertion of the first signal, the frequency of the input signal is greater than the predetermined frequency, and if the opposite polarity transition occurs after the assertion of the first signal, the frequency of the input signal is less than the predetermined frequency.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
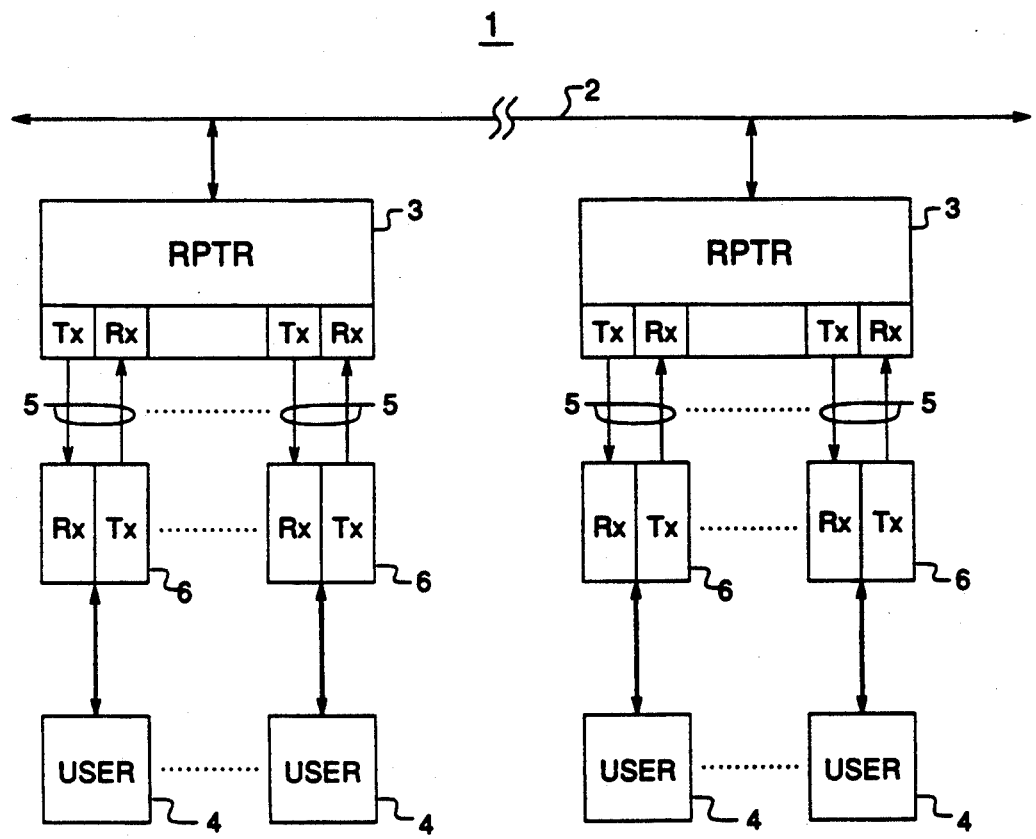
FIG. 1 is a diagram of an exemplary local area network communication system.
Figure 2:
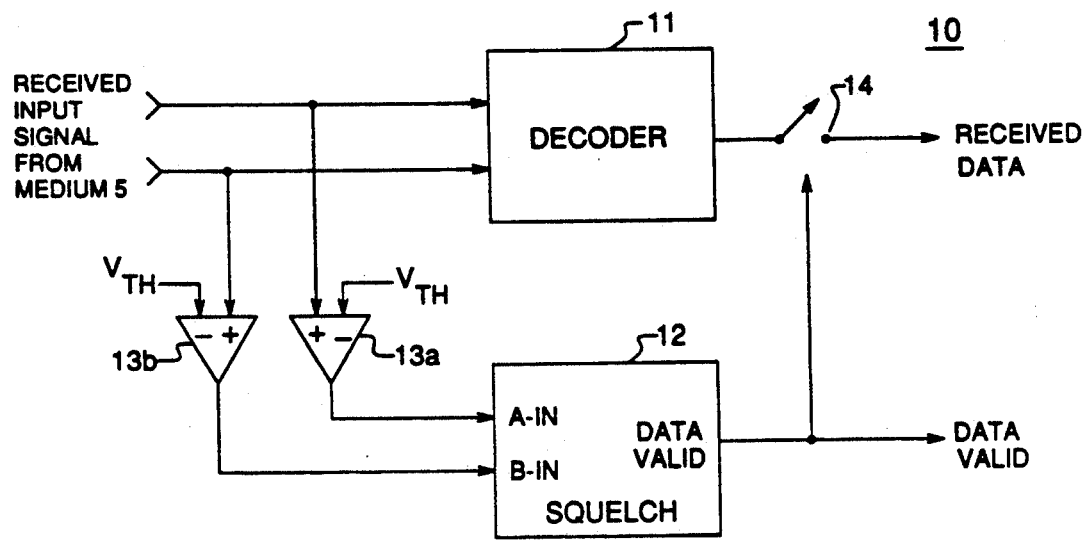
FIG. 2 is diagram of a digital data receiver in the exemplary local area network of FIG. 1.

An exemplary digital data receiver 10 for packet applications, such as in the network diagramed in FIG. 1, is shown in FIG. 2. It is understood that the invention embodied in the receiver 10, described herein, may be applicable to virtually any digital receiver application, such as the receiver (not shown) used by the repeater 3 (FIG. 1) to communicate on the backbone 2 or in burst mode satellite communication systems.

The receiver 10 has a decoder 11 which converts the input signals from medium 5, here a differential signal from a twisted pair, to digital data signals having uniform amplitude. If desired, the receiver 10 may also re-time the data. An exemplary decoder 11 is a differential comparator (without retiming capability), such as that shown in U.S. Pat. No. 4,818,929, assigned to the same assignee as this invention.

Squelch circuit 12 is driven by slicers 13a, 13b, each having a slicing voltage of $V_{TH}$. The slicing voltage, $V_{TH}$, sets the minimum amplitude that each signal comprising the differential input signal from medium 5 must exceed to be considered a data signal and be applied to squelch 12. In addition, each slicer 13a, 13b converts the differential input signals to two single-ended output signals. As will be shown in more detail below, if the differential input signals do not exceed the slicing limits, the outputs of the slicers 13a, 13b are "low". This creates a "dead zone" in input signal amplitudes that the slicers 13a, 13b will not respond to, thereby increasing the noise immunity of the receiver 10. It is noted that while the input signals from medium 5 are described as differential, non-differential signals may be used. However, as will become apparent, the squelch circuit 12 relies on detecting positive-going and negative-going edges in the input signals and a means must be provided with non-differential input signals to generate positive and negative edge signals.

The squelch circuit 12 determines if a valid data signal is being received by the receiver 10. As determined by the squelch 12, if certain predetermined criteria for a valid data signal are met, the switch 14 closes and allows the decoded data from decoder 11 to pass. The predetermined criteria may include, but is not limited to, a minimum number of transitions in the input signal and the frequency of the input signal being above a minimum frequency and/or below a maximum frequency, or a combination of the foregoing. Preferably, the transitions necessary for the squelch 12 to operate must also meet the frequency restrictions given above. The above is achieved by triggering a counter (not shown) within the squelch 12 when a first polarity transition in the input signal has occurred. The counter asserts a signal a predetermined time after being triggered, the predetermined time being the one-half of one cycle of a predetermined frequency. If the signal from the counter is asserted when an opposite polarity transition occurs, then the frequency of the input signal is less than the predetermined frequency. Conversely, if the signal is not asserted when the opposite polarity transition occurs, the frequency of the input signal is greater than the predetermined frequency. If, for example, two or more alternating polarity transitions occur meeting the desired frequency characteristics are received, then the received signal is probably a valid packet and the output of the decoder 11 is passed through switch 14. If, at any time during reception of an otherwise valid packet data signal, transitions occur which do not satisfy the frequency requirements described above, such as during a collision of packets on the LAN when two "talkers" are talking at once, the data valid signal may be cleared. Alternatively, the data valid signal may be cleared by another circuit (not shown) at the end of the packet transmission.

EXAMPLE

Figure 3:
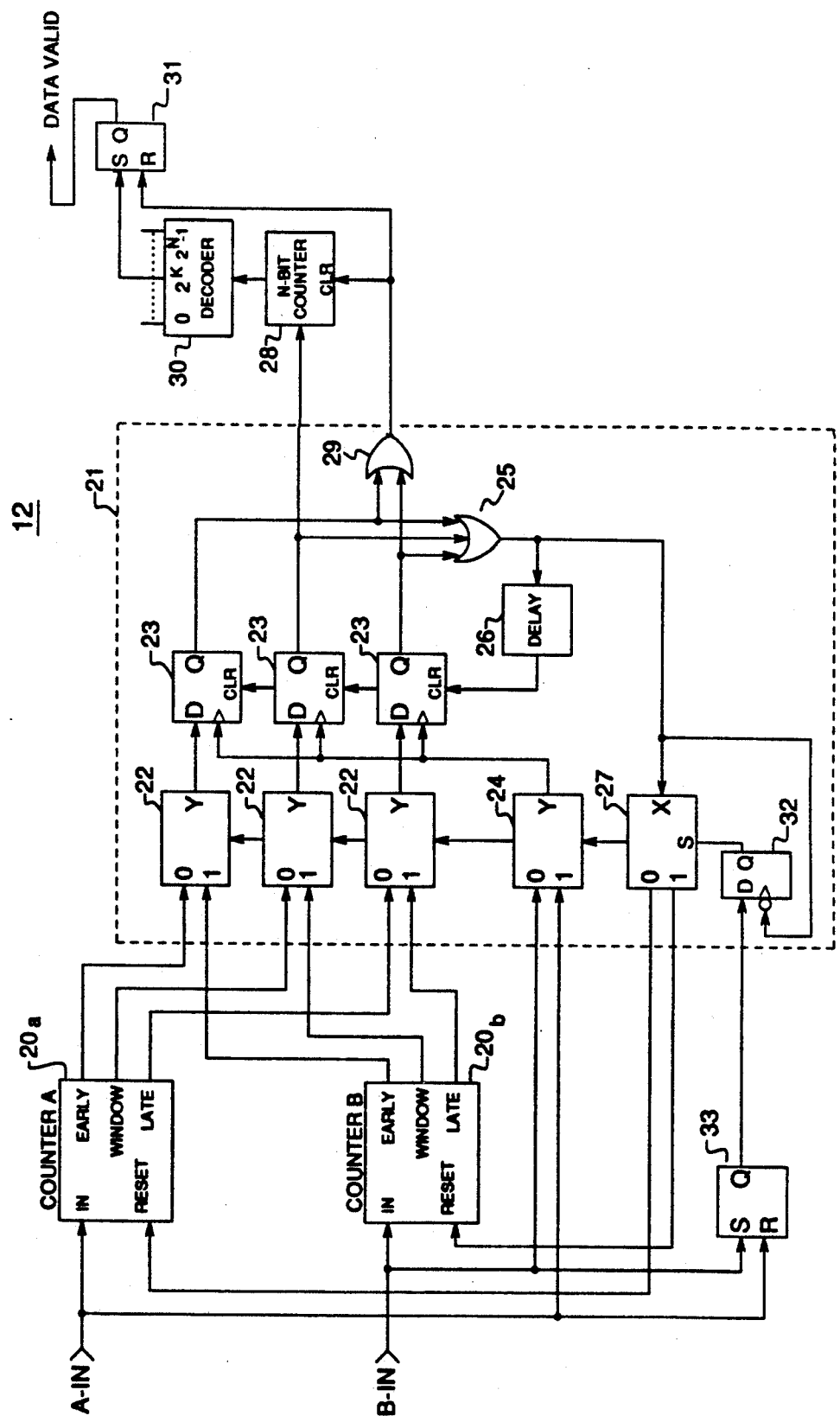
FIG. 3 is an exemplary embodiment of the squelch circuit in FIG. 2.
Figure 4:
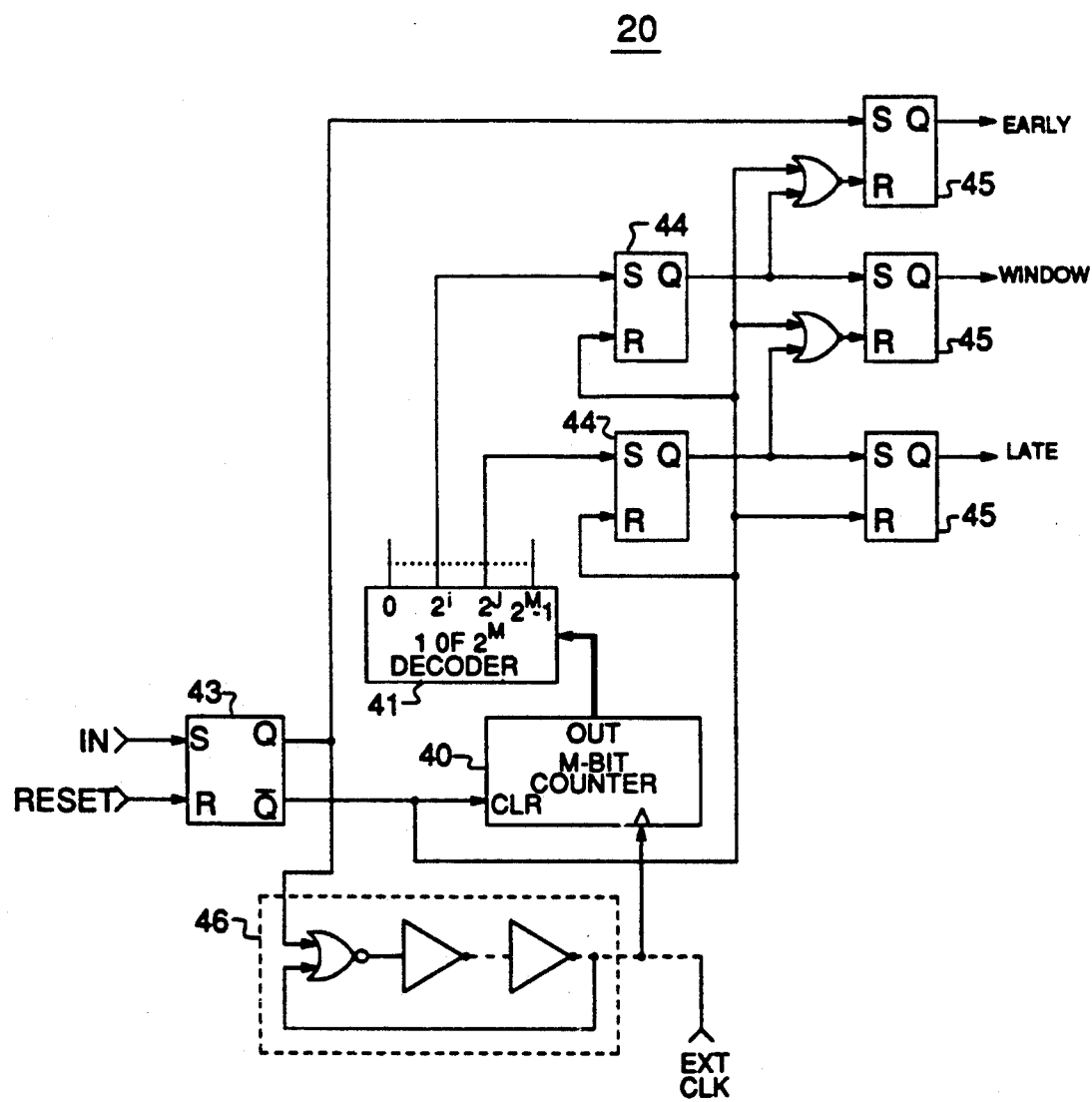
FIG. 4 is an exemplary embodiment of one of the counters in FIG. 3.

The following exemplary embodiment shown in FIGS. 3 and 4 provides the above-described squelch function. As such, the input signal is checked against both a minimum and maximum frequency limit as well as checking for a minimum number of alternating transitions, which meet the aforementioned frequency limits, for the acceptance of an input signal as a valid data packet. It is understood, however, that a subset of the aforementioned criteria may be implemented, reducing the number of circuit components described herein to implement the squelch function. In addition, it will become apparent to one with ordinary skill in the art that there are many different ways to implement the squelch function once the operation of this exemplary embodiment is described.

In FIG. 3, the exemplary embodiment of the squelch circuit 12 (FIG. 2) is shown. Two substantially identical counters, 20a and 20b, are triggered by a transition on the respective inputs A-IN and B-IN to the squelch 12. The counters 20a, 20b are triggered in response to opposite polarity transitions in the differential input signal to the receiver 10 (FIG. 2). The outputs EARLY, WINDOW, and LATE of the counters 20a, 20b, relate to the significance of the next transition in the input signal (having an opposite polarity to the transition which triggered the enabled counter) when one of the outputs of counters 20a, 20b is asserted. For example, if the next transition occurs when the EARLY signal is asserted, that transition occurred too soon, indicating the frequency of the input signal is too high. Similarly, if the next transition occurs when the LATE signal is asserted, that transition occurred to late, indicating that the frequency of the input signal is too low. However, if the next transition occurs when the WINDOW signal is asserted, the frequency of the input signal is within the desirable range.

Figure 5:
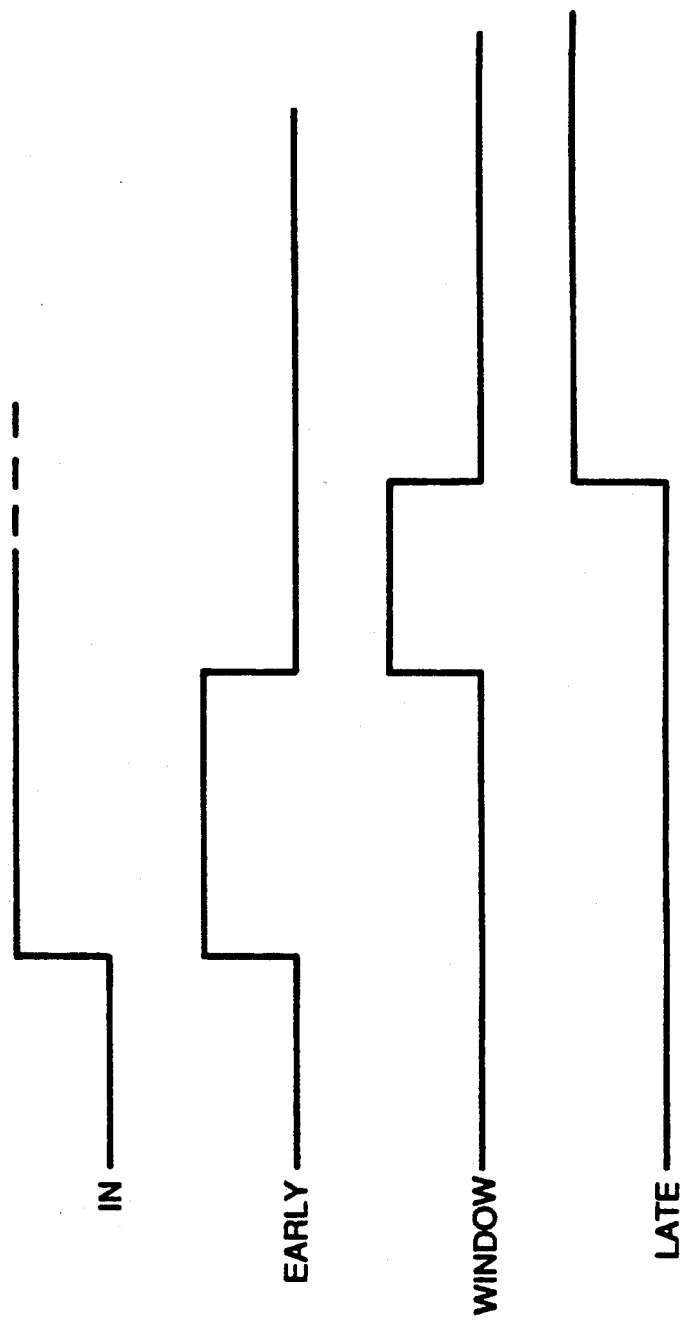
FIG. 5 is a timing diagram (not to scale) of the operation of the counter of FIG. 4; and, FIG. 6 is a timing diagram (not to scale) of the operation of the squelch circuit of FIG. 3.

The details of the counters 20a, 20b are shown in FIG. 4 as counter 20 and illustrated in the timing diagram of FIG. 5. The counter 20 produces the three output signals, EARLY, WINDOW, and LATE as a function of the count of the M-bit counter 40. The output of the counter 40 drives a one-of-$2^M$ decoder 41. The EARLY signal is asserted immediately after the counter 20 is triggered by an input signal to the input IN setting flip-flop 43. A predetermined time later, determined by which output of the decoder 41 is selected and the frequency of the clock to the counter 40 as will be discussed below, causes the WINDOW signal to be asserted and the EARLY signal is cleared. A different predetermined time after the triggering of the counter 20, again as determined by which output of the decoder 41 is selected and the frequency of the clock to the counter 40, the LATE signal is asserted and the WINDOW signal is cleared. The outputs of decoder 41 are pulses that are latched by flip-flops 44. All the outputs (EARLY, WINDOW, and LATE) are latched by flip-flops 45. A pulse to the RESET input of the counter 20 clears the asserted outputs of the counter 20 by clearing flip-flop 43 which clears flip-flops 44, 45 and counter 40 to ready the counter 20 for a new input.

As discussed above, the predetermined time intervals are determined by which outputs of the decoder 41 are selected and the frequency of the clock to the counter 40. The clock frequency may be derived from an external source, such as a master system clock (not shown) applied to the EXT CLK input, or from a gated ring oscillator 46 having a predetermined frequency of oscillation once enabled.

Also as discussed above, the predetermined time interval, during which the EARLY signal is asserted, corresponds to the highest frequency input signal the squelch 12 will accept. Similarly, the other predetermined time interval (ending when the LATE signal is asserted) corresponds to the lowest frequency input signal the squelch 12 will accept. Note that the corresponding predetermined time intervals for both counters 20a, 20b (FIG. 3) should be substantially the same.

Returning to FIG. 3, the outputs of the counters 20a, 20b are fed to a next edge detector (NED) 21 which controls the operation of the counters 20a, 20b depending on the polarity of the most recent transition in the input signal. The NED 21 has multiplexers 22 which select which counter 20a, 20b output is to be used for measuring the time to the next (opposite polarity) transition. When a counter is triggered, for example counter 20a, the outputs of counter 20a are sampled by D-type flip-flops 23 when an opposite polarity transition occurs. Multiplexer 24 couples the appropriate opposite polarity transition pulse from the inputs A-IN or B-IN to the clock inputs of the flip-flops 23 (from the B-IN input in this example) to control when the outputs of counter 20a are sampled by flip-flops 23.

The outputs of the flip-flops 23 are ORed together by OR gate 25, the output of which is delayed by delay 26, and the flip-flops 23 are cleared. The delayed clearing of the flip-flops 23 generates a pulse at the output of OR gate 25 which clears the triggered counter, here counter 20a, through the demultiplexer 27. As will be discussed in more detail below in connection with FIG. 6, if the opposite polarity transition should occur during the interval the WINDOW signal from the triggered counter (here 20a) is asserted, the N-bit counter 28 is incremented. If, however, the transition occurs when the EARLY or LATE signal is asserted, the counter 28 is cleared by the ORing of the sampled signals from flip-flops 23 by OR gate 29. Counter 28 counts the minimum number of sequential opposite polarity transitions in the input signal from medium 5 (FIG. 2) that meets the frequency criteria, discussed above. When a predetermined number of valid transitions occur, determined by the selection of the appropriate output of the decoder 30 and latched by flip-flop 31, the DATA VALID output signal from the squelch 12 is asserted.

The configuration of the multiplexers 22, 24 and demultiplexer 27, to select which counter 20a, 20b output is to be sampled and which input transition is to trigger the sampling, is controlled by D-type flip-flop 32. Flip-flop 32 samples the output of flip-flop 33 after the reset pulse from OR gate 25, through demultiplexer 27, clears the triggered counter 20a or 20b. Flip-flop 33 stores which polarity transition occurred last (from the signal on corresponding input A-IN or B-IN) such that when flip-flop 32 is clocked after the reset pulse, the multiplexers 22, 24 and demultiplexer 27 are reconfigured.

Figure 6:
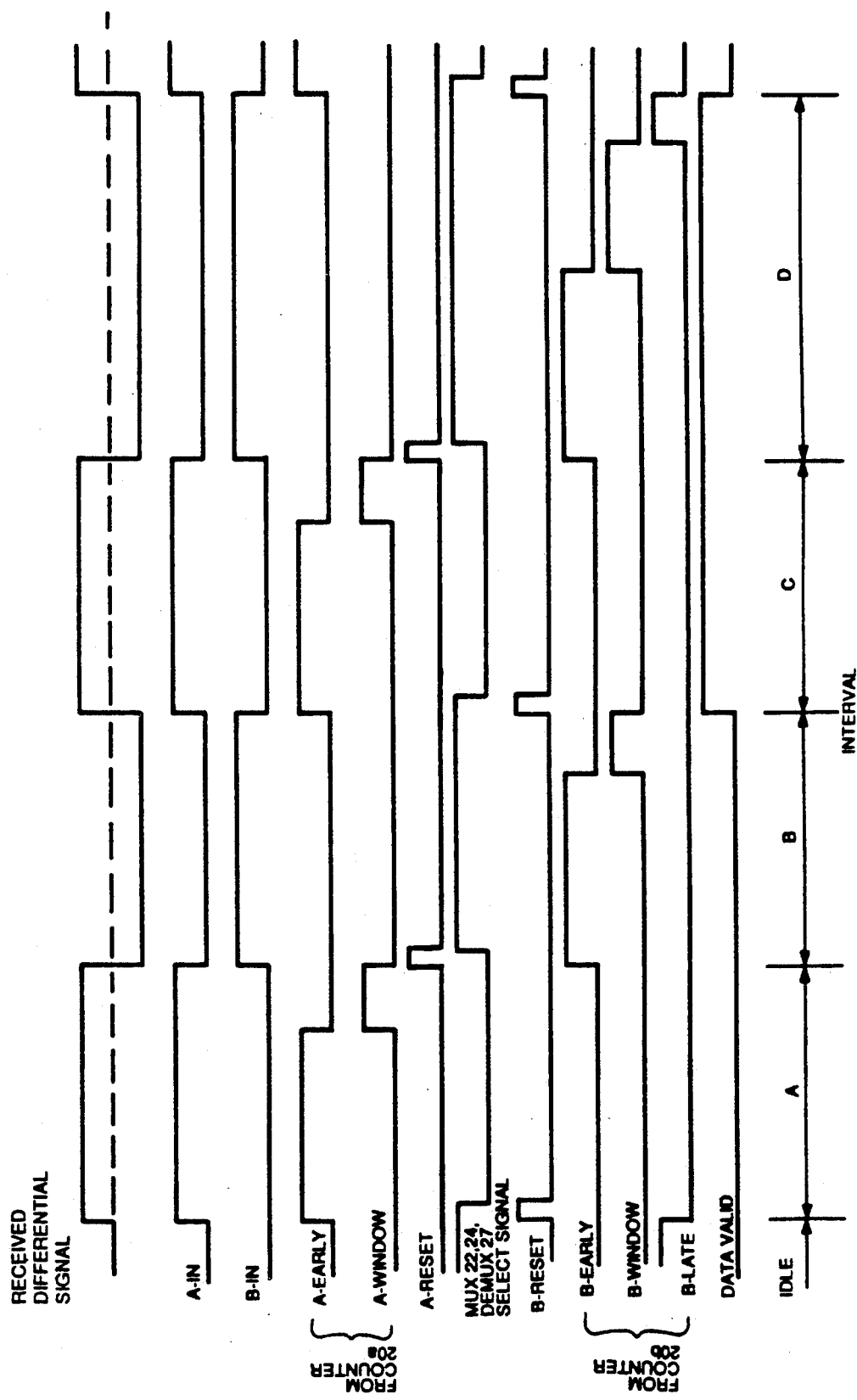

Operation of the exemplary embodiment shown in FIGS. 2, 3, and 4 is illustrated in a timing diagram in FIG. 6. The received input signal is shown here as a differential signal corresponding to what would be received from medium 5 as shown in FIG. 2. The differential input signal has at least two valid transitions and an invalid transition to illustrate the detection of a valid data signal and the result of detecting an invalid data signal. For purposes of this illustration, the differential input signal is shown starting from an idle state in which the signal amplitude was approximately zero (neither high nor low).

Operation of the slicers 13a, 13b of FIG. 2 is shown. The A-IN input to the squelch 12 goes high when the received differential input signal goes sufficiently positive (exceeding $V_{TH}$, a "high") and goes low when the received signal goes negative (a "low"). Similarly, when the received differential input signal goes sufficiently low (below $-V_{TH}$), the B-IN input signal to the squelch 12 goes high and goes low when the received signal goes high. Hence, the signals to A-IN and B-IN inputs represent the received input signal being high and low, respectively. Note that when the differential input signal is idle, both A-IN and B-IN are low.

As discussed above, when the received input signal goes high (for purposes here as signifying the beginning of interval A), the counter 20a in FIG. 3 begins counting, asserting its output EARLY. After a predetermined interval of time, the WINDOW signal from the counter 20a is asserted, clearing the EARLY signal. When the input signal goes negative, ending interval A and beginning interval B, a reset pulse (A-RESET) is applied to the counter 20a, clearing the WINDOW signal from counter 20a, while counter 20b begins counting. As will be discussed in more detail below, during the idle interval (between packets) the LATE output from counter 20b is asserted and then cleared by the positive transition in the input signal generating the B-RESET signal.

As shown during interval B, the counter 20b asserts its EARLY signal until a predetermined time later when the WINDOW signal is asserted, clearing the EARLY signal. When a positive transition in the input signal occurs ending interval B and beginning interval C, the counter 20b is reset (B-RESET), and the counter 20a begins counting. Note that the LATE signal from counter 20b is not asserted.

During interval C, as discussed above in connection with interval A, the EARLY signal from counter 20a is asserted then cleared when the WINDOW signal is asserted thereby. The negative transition by the input signal triggers counter 20b and clears counter 20a (A-RESET).

During interval D, again as discussed above, the EARLY signal is asserted by counter 20b and then cleared when the WINDOW signal is asserted. However, a predetermined time after the beginning of the interval D, the LATE signal from counter 20b is asserted clearing the WINDOW signal. At the end of the D interval, the input signal transitions positively, clearing the counter 20b (B-RESET) and starting the counter 20a. Since the positive transition in the input signal occurs when the LATE signal is asserted, the frequency of the input signal fails the minimum frequency criteria discussed above.

Since at least two reset pulses to counters 20a, 20b (A-RESET and B-RESET signals) were in response to "valid" input transitions (they all met the frequency limitations discussed above by occurring when a WINDOW signal was asserted), the DATA VALID signal is asserted with the beginning of interval C. This results from the counter 28 (FIG. 3) being incremented two times, and with the appropriate output of the decoder 30 selected, the flip-flop 30 is set, asserting DATA VALID. However, after three valid transitions, the next transition occurs (ending interval D) when the LATE signal is asserted from counter 20b, the counter 28 is cleared along with the flip-flop 31, clearing DATA VALID. Note that the first reset pulse to counter 20b (B-RESET) is not "valid" since the first transition in the input signal ended the idle state (during which the LATE signal from counter 20b was asserted).

Also note that the select signal to the multiplexers 22, 24 and demultiplexer 27 (FIG. 3) changes state with the falling edge of the reset pulses (A-RESET and B-RESET). The delay in changing state assures that the pulses generated by the clearing of the flip-flops 23 using OR gate 25 and delay 26 are finished before the multiplexers 22, 24 and demultiplexer 27 are reconfigured.

END EXAMPLE

To implement the proposed IEEE 802.3 10 Base-T proposed standard using the foregoing example, the predetermined time interval during which the EARLY signal is asserted is approximately 50 nanoseconds. The other predetermined time interval (ending when the LATE signal is asserted) is approximately 150 nanoseconds. This corresponds to a maximum frequency of approximately 10 MHz and a minimum frequency of approximately 3.33 MHz. In addition, for DATA VALID to be asserted, a minimum of two sequential alternating polarity transitions meeting the above frequency criteria must be received.

It is also possible to use the foregoing example to implement an adaptive receiver so that multiple data rates may be utilized. In particular, if data is being received that does not meet the frequency criteria discussed above, then the predetermined time intervals may be changed and the received data reevaluated.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

I claim:

1. A circuit disposed in an integrated circuit, for comparing an input signal to a first predetermined frequency, characterized by:
   a first timing means for generating a first signal at a first predetermined time after a first polarity transition in an input signal; and,
   first comparing means, responsive to the first and input signals, for determining if a second polarity transition in the input signal occurs before or after the first signal is asserted, the second polarity being opposite the first polarity;
   wherein the first predetermined time is substantially one-half the inverse of the first predetermined frequency and the first comparing means indicates to a first output that the frequency of the input signal is greater than or less than the first predetermined frequency.

2. The circuit recited in claim 1, further characterized by:
   a second timing means for generating a second signal at the first predetermined time after the second polarity transition in the input signal;
   wherein the first comparing means is additionally responsive to the second signal and additionally determines if the first polarity transition in the input signal occurs before or after the second signal is asserted.

3. The circuit recited in claim 2, further characterized by:
   the first timing means generating a third signal a second predetermined time after the first polarity transition in the input signal and before the assertion of the first signal;
   the second timing means generating a fourth signal at the second predetermined time after the second polarity transition in the input signal and before the assertion of the second signal; and,
   second comparing means, responsive to the input, third, and fourth signals, determines if the second polarity transition in the input signal occurs after the third signal is asserted or if the first polarity transition in the input signal occurs after the fourth signal is asserted, thereby indicating to a second output that the frequency of the input signal is less than a second predetermined frequency;
   wherein the second predetermined time is substantially one-half the inverse of the second predetermined frequency, the second predetermined frequency is greater than the first predetermined frequency, and the first comparing means indicates that the frequency of the input signal is greater than the first predetermined frequency.

4. The circuit as recited in claim 3, wherein the first polarity transition is positive and the second polarity transition is negative.

5. The circuit as recited in claim 3, wherein the first and second timing means are each characterized by:
   counting means, responsive to a clock signal of a third predetermined frequency, for providing first and second outputs in response to the corresponding positive or negative transition in the input signal;
   wherein the first and second outputs correspond to the first and third signals, respectively, of the first timing means and to the second and fourth signals, respectively, of the second timing means.

6. The circuit as recited in claim 5, wherein the counting means are characterized by a plurality of flip-flops.

7. In a digital data receiver, a squelch circuit for enabling the output of the receiver if valid data is received having a data rate (frequency) which is at least greater than the first predetermined frequency, the squelch circuit being characterized by the circuit as recited in claim 2.

8. In a digital data receiver, a squelch circuit for enabling the output of the receiver if valid data is received having a data rate (frequency) which is greater than the first predetermined frequency and less than the second predetermined frequency, the squelch circuit being characterized by the circuit as recited in claim 3.

9. The digital data receiver as recited in claims 7 or 8, the squelch circuit being further characterized by:
   a sequencer means for enabling the receiver if the input signal has at least two alternating polarity transitions therein, the frequency of the transitions after the first transition being at least greater than the first predetermined frequency.

10. A method of determining if an input signal has a frequency which is greater than or less than a first predetermined frequency, characterized by the steps of:
   asserting a first signal at a predetermined time after a first polarity transition in the input signal, the predetermined time being substantially one-half the inverse of the first predetermined frequency; and,
   determining if a second polarity transition in the input signal occurred before or after the assertion of the first signal, the second polarity being opposite the first polarity;
   wherein if the second polarity transition occurs before the assertion of the first signal, the frequency of the input signal is greater than the first predetermined frequency, and if the second polarity transition occurs after the assertion of the first signal, the frequency of the input signal is less than the first predetermined frequency.

11. The method of determining if an input signal has a frequency which is greater than or less than a first predetermined frequency as recited in claim 10, further characterized by:

asserting a second signal at a predetermined time after the second polarity transition in the input signal, the predetermined time being substantially one-half the inverse of the first predetermined frequency; and, determining if the first polarity transition in the input signal occurred before or after the assertion of the second signal;

wherein if the first polarity transition occurs before the assertion of the second signal, the frequency of the input signal is greater than the first predetermined frequency, and if the first polarity transition occurs after the assertion of the second signal, the frequency of the input signal is less than the first predetermined frequency.

12. The method of claim 11, further characterized by the steps of:

detecting a third transition of the first polarity in the input signal; and, determining if the frequency of the third transition is greater than the first predetermined frequency as determined in the steps recited in claim 11;

wherein the input signal is a noise pulse unless the frequency of the second and third transitions are greater than the first predetermined frequency.

13. The method as recited in claim 12, wherein the input signal is a noise pulse unless the frequency of the second and third transitions are less than a second predetermined frequency the second predetermined frequency being greater than the first predetermined frequency.

14. The method as recited in claim 11, further characterized by the steps of:

detecting a third transition of the first polarity in the input signal, the frequency of the third transition being less than the first predetermined frequency as determined in the steps recited in claim 11;

wherein the input signal is a noise pulse unless the frequency of the second and third transitions are less than the first predetermined frequency.

* * * * *